(12) United States Patent
Lim et al.

(10) Patent No.: US 7,209,059 B2
(45) Date of Patent: Apr. 24, 2007

(54) DECODING METHOD AND ENCODING METHOD

(75) Inventors: Chong Soon Lim, Singapore (SG);
Sheng Mei Shen, Singapore (SG);
Shinya Kadono, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/293,154

(22) Filed: Dec. 5, 2005

(65) Prior Publication Data

US 2006/0119490 A1 Jun. 8, 2006

Related U.S. Application Data

(60) Provisional application No. 60/632,968, filed on Dec. 6, 2004.

(51) Int. Cl.
*H03M 7/40* (2006.01)
(52) U.S. Cl. .......................... 341/67; 341/65
(58) Field of Classification Search .................. 341/67, 341/63, 50, 107
See application file for complete search history.

(56) References Cited

U.S. PATENT DOCUMENTS

| | | | | |
|---|---|---|---|---|
| 4,890,326 A | * | 12/1989 | Euler | ........................ 704/229 |
| 5,510,785 A | * | 4/1996 | Segawa et al. | ................ 341/67 |
| 6,414,608 B1 | * | 7/2002 | Nishida et al. | ................ 341/67 |
| 6,954,157 B2 | * | 10/2005 | Kadono et al. | ................ 341/67 |
| 6,967,600 B2 | * | 11/2005 | Kadono et al. | ................ 341/67 |
| 7,106,225 B2 | * | 9/2006 | Nagata et al. | ................ 341/67 |
| 2004/0228535 A1 | | 11/2004 | Honda et al. | |

OTHER PUBLICATIONS

International Standard ISO/IEC 14496-10, Second Edition, Oct. 1, 2004.
International Standard ISO/IEC 14496-2, Third Edition, Jun. 1, 2004.
International Standard ISO/IEC 13818-2, Second Edition, Dec. 15, 2000.
U.S. Appl. No. 11/230,516, to Bi et al., which was filed Sep. 21, 2005.

* cited by examiner

*Primary Examiner*—Peguy JeanPierre
(74) *Attorney, Agent, or Firm*—Greenblum & Bernstein, P.L.C.

(57) ABSTRACT

A decoding method according to the present invention is a method of decoding a variable length code to a Run symbol and a Level symbol. The Run symbol indicates the number of consecutive coefficients each having a value of zero. The Level symbol indicates a value of a non-zero coefficient following the Run symbol. The decoding method includes: decoding a variable length code to a code number; determining whether the code number obtained in the decoding belongs to a first range or a predetermined range; decoding the code number to a Run symbol and a Level symbol by referring to the table, when it is determined that the code number belongs to the first range; and decoding the code number to a Level symbol and then decoding a variable length code following the decoded variable length code to a Run symbol, without referring to the table, when it is determined that the code number belongs to the predetermined range.

3 Claims, 19 Drawing Sheets

FIG. 1

VLC_Intra0

| Run | Level > 0 | | | |
|---|---|---|---|---|
| | 1 | 2 | 3 | 4 |
| 0 | 0 | 8 | 16 | 30 |
| 1 | 2 | 18 | 36 | – |
| 2 | 4 | 20 | – | – |
| 3 | 6 | 26 | – | – |
| 4 | 12 | 32 | – | – |
| 5 | 10 | 34 | – | – |
| 6 | 14 | – | – | – |
| 7 | 22 | – | – | – |
| 8 | 24 | – | – | – |
| 9 | 28 | – | – | – |

FIG. 2

VLC_Intra1

| Run | EOB | Level > 0 | | | | | |
|---|---|---|---|---|---|---|---|
| | | 1 | 2 | 3 | 4 | 5 | 6 |
| | 0 | – | – | – | – | – | – |
| 0 | – | 1 | 5 | 9 | 15 | 27 | 31 |
| 1 | – | 3 | 13 | 23 | 35 | – | – |
| 2 | – | 7 | 19 | 33 | – | – | – |
| 3 | – | 11 | 25 | – | – | – | – |
| 4 | – | 17 | 37 | – | – | – | – |
| 5 | – | 21 | – | – | – | – | – |
| 6 | – | 29 | – | – | – | – | – |

FIG. 3

VLC_Intra2

| Run | EOB | Level > 0 | | | | | |
|---|---|---|---|---|---|---|---|
| | | 1 | 2 | 3 | 4 | 5 | 6 |
| | 2 | – | – | – | – | – | – |
| 0 | – | 0 | 3 | 9 | 15 | 23 | 33 |
| 1 | – | 5 | 11 | 19 | 31 | – | – |
| 2 | – | 7 | 17 | 27 | 35 | – | – |
| 3 | – | 13 | 25 | – | – | – | – |
| 4 | – | 21 | 37 | – | – | – | – |
| 5 | – | 29 | – | – | – | – | – |

FIG. 4

VLC_Intra3

| Run | EOB | Level > 0 | | | | | | | |
|---|---|---|---|---|---|---|---|---|---|
| | | 1 | 2 | 3 | 4 | 5 | 6 | 7 | 8 |
| | 0 | – | – | – | – | – | – | – | – |
| 0 | – | 1 | 3 | 5 | 9 | 13 | 23 | 25 | 31 |
| 1 | – | 7 | 11 | 17 | 27 | 37 | – | – | – |
| 2 | – | 15 | 19 | 33 | – | – | – | – | – |
| 3 | – | 21 | 35 | – | – | – | – | – | – |
| 4 | – | 29 | – | – | – | – | – | – | – |

FIG. 5

VLC_Intra4

| Run | EOB | Level > 0 | | | | | | | | | |
|---|---|---|---|---|---|---|---|---|---|---|---|
| | | 1 | 2 | 3 | 4 | 5 | 6 | 7 | 8 | 9 | 10 |
| | 0 | – | – | – | – | – | – | – | – | – | – |
| 0 | – | 1 | 3 | 5 | 7 | 11 | 15 | 17 | 23 | 31 | 35 |
| 1 | – | 9 | 13 | 19 | 27 | 33 | – | – | – | – | – |
| 2 | – | 21 | 25 | 37 | – | – | – | – | – | – | – |
| 3 | – | 29 | – | – | – | – | – | – | – | – | – |

FIG. 6

VLC_Intra5

| Run | EOB | Level > 0 | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| | 0 | – | – | – | – | – | – | – | – | – | – | – | – |
| 0 | – | 1 | 3 | 5 | 7 | 9 | 11 | 13 | 19 | 21 | 25 | 31 | 35 |
| 1 | – | 15 | 17 | 23 | 29 | 33 | – | – | – | – | – | – | – |
| 2 | – | 27 | 37 | – | – | – | – | – | – | – | – | – | – |

FIG. 7

VLC_Intra6

| Run | EOB | Level > 0 | | | | | | | | | | | | | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 |
| | 0 | – | – | – | – | – | – | – | – | – | – | – | – | – | – | – |
| 0 | – | 3 | 1 | 5 | 7 | 9 | 11 | 13 | 15 | 17 | 19 | 21 | 23 | 31 | 29 | 33 |
| 1 | – | 25 | 27 | 35 | 37 | – | – | – | – | – | – | – | – | – | – | – |

FIG. 8

VLC_Inter0

| Run | Level>0 | | | |
|---|---|---|---|---|
| | 1 | 2 | 3 | 4 |
| 0 | 0 | 10 | 22 | 36 |
| 1 | 2 | 20 | – | – |
| 2 | 4 | 24 | – | – |
| 3 | 6 | 26 | – | – |
| 4 | 8 | 34 | – | – |
| 5 | 12 | 30 | – | – |
| 6 | 14 | – | – | – |
| 7 | 16 | – | – | – |
| 8 | 18 | – | – | – |
| 9 | 32 | – | – | – |
| 10 | 28 | – | – | – |

FIG. 9

VLC_Inter1

| Run | EOB | Level > 0 | | | | |
|---|---|---|---|---|---|---|
| | | 1 | 2 | 3 | 4 | 5 |
| | 0 | – | – | – | – | – |
| 0 | – | 1 | 7 | 15 | 27 | 37 |
| 1 | – | 3 | 17 | 33 | – | – |
| 2 | – | 5 | 21 | – | – | – |
| 3 | – | 9 | 29 | – | – | – |
| 4 | – | 11 | 35 | – | – | – |
| 5 | – | 13 | – | – | – | – |
| 6 | – | 19 | – | – | – | – |
| 7 | – | 23 | – | – | – | – |
| 8 | – | 25 | – | – | – | – |
| 9 | – | 31 | – | – | – | – |

FIG. 10

VLC_Inter2

| Run | EOB | Level > 0 | | | | |
|---|---|---|---|---|---|---|
| | | 1 | 2 | 3 | 4 | 5 |
| | 0 | – | – | – | – | – |
| 0 | – | 1 | 9 | 17 | 23 | 37 |
| 1 | – | 3 | 15 | 27 | – | – |
| 2 | – | 5 | 19 | 33 | – | – |
| 3 | – | 7 | 21 | – | – | – |
| 4 | – | 11 | 31 | – | – | – |
| 5 | – | 13 | 35 | – | – | – |
| 6 | – | 25 | – | – | – | – |
| 7 | – | 29 | – | – | – | – |

FIG. 11

VLC_Inter3

| Run | EOB | Level > 0 | | | | | |
|---|---|---|---|---|---|---|---|
| | | 1 | 2 | 3 | 4 | 5 | 6 |
| | 0 | – | – | – | – | – | – |
| 0 | – | 1 | 7 | 11 | 21 | 27 | 35 |
| 1 | – | 3 | 13 | 25 | 37 | – | – |
| 2 | – | 5 | 17 | 29 | – | – | – |
| 3 | – | 9 | 19 | – | – | – | – |
| 4 | – | 15 | 31 | – | – | – | – |
| 5 | – | 23 | 33 | – | – | – | – |

FIG. 12

VLC_Inter4

| Run | EOB | Level > 0 | | | | | | |
|---|---|---|---|---|---|---|---|---|
| | | 1 | 2 | 3 | 4 | 5 | 6 | 7 |
| | 0 | – | – | – | – | – | – | – |
| 0 | – | 1 | 3 | 7 | 13 | 21 | 27 | 35 |
| 1 | – | 5 | 11 | 19 | 31 | – | – | – |
| 2 | – | 9 | 17 | 33 | – | – | – | – |
| 3 | – | 15 | 29 | – | – | – | – | – |
| 4 | – | 23 | 37 | – | – | – | – | – |
| 5 | – | 25 | – | – | – | – | – | – |

FIG. 13

VLC_Inter5

| Run | EOB | Level > 0 | | | | | | | | |
|---|---|---|---|---|---|---|---|---|---|---|
| | | 1 | 2 | 3 | 4 | 5 | 6 | 7 | 8 | 9 |
| | 0 | – | – | – | – | – | – | – | – | – |
| 0 | – | 1 | 3 | 5 | 9 | 11 | 17 | 21 | 29 | 33 |
| 1 | – | 7 | 13 | 19 | 25 | 35 | – | – | – | – |
| 2 | – | 15 | 23 | 31 | – | – | – | – | – | – |
| 3 | – | 27 | – | – | – | – | – | – | – | – |
| 4 | – | 37 | – | – | – | – | – | – | – | – |

FIG. 14

VLC_Inter6

| Run | EOB | Level > 0 | | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 | 13 |
| | 0 | – | – | – | – | – | – | – | – | – | – | – | – | – |
| 0 | – | 1 | 3 | 5 | 7 | 9 | 11 | 13 | 17 | 21 | 23 | 27 | 33 | 37 |
| 1 | – | 15 | 19 | 25 | 29 | 35 | – | – | – | – | – | – | – | – |
| 2 | – | 31 | – | – | – | – | – | – | – | – | – | – | – | – |

FIG. 15

VLC_Chroma0

| Run | Level > 0 | | | | | |
|---|---|---|---|---|---|---|
| | 1 | 2 | 3 | 4 | 5 | 6 |
| | – | | – | – | – | – |
| 0 | 0 | 6 | 14 | 18 | 24 | 36 |
| 1 | 2 | 20 | – | – | – | – |
| 2 | 4 | 28 | – | – | – | – |
| 3 | 8 | 26 | – | – | – | – |
| 4 | 10 | – | – | – | – | – |
| 5 | 12 | 34 | – | – | – | – |
| 6 | 16 | – | – | – | – | – |
| 7 | 22 | – | – | – | – | – |
| 8 | 30 | – | – | – | – | – |
| 9 | 32 | – | – | – | – | – |

FIG. 16

VLC_Chroma1

| Run | EOB | Level > 0 | | | | | | |
|---|---|---|---|---|---|---|---|---|
| | | 1 | 2 | 3 | 4 | 5 | 6 | 7 |
| | 0 | – | – | – | – | – | – | – |
| 0 | – | 1 | 7 | 11 | 19 | 23 | 29 | 33 |
| 1 | – | 3 | 13 | 25 | – | – | – | – |
| 2 | – | 5 | 21 | – | – | – | – | – |
| 3 | – | 9 | 27 | – | – | – | – | – |
| 4 | – | 15 | – | – | – | – | – | – |
| 5 | – | 17 | – | – | – | – | – | – |
| 6 | – | 31 | – | – | – | – | – | – |
| 7 | – | 35 | – | – | – | – | – | – |
| 8 | – | 37 | – | – | – | – | – | – |

FIG. 17

VLC_Chroma2

| Run | EOB | Level > 0 | | | | | | | | |
|---|---|---|---|---|---|---|---|---|---|---|
| | | 1 | 2 | 3 | 4 | 5 | 6 | 7 | 8 | 9 |
| | 0 | – | – | – | – | – | – | – | – | – |
| 0 | – | 1 | 3 | 7 | 9 | 15 | 19 | 25 | 29 | 35 |
| 1 | – | 5 | 11 | 17 | 27 | – | – | – | – | – |
| 2 | – | 13 | 21 | 37 | – | – | – | – | – | – |
| 3 | – | 23 | 33 | – | – | – | – | – | – | – |
| 4 | – | 31 | – | – | – | – | – | – | – | – |

FIG. 18

VLC_Chroma3

| Run | EOB | Level > 0 | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| | 0 | – | – | – | – | – | – | – | – | – | – | – | – |
| 0 | – | 1 | 3 | 5 | 7 | 11 | 13 | 17 | 23 | 25 | 29 | 31 | 33 |
| 1 | – | 9 | 15 | 19 | 27 | 35 | 37 | – | – | – | – | – | – |
| 2 | – | 21 | – | – | – | – | – | – | – | – | – | – | – |

FIG. 19

Examples of k type Exp-Golomb Codes

| Type | Bits | CodeNum Values |
|---|---|---|
| k = 0 | 1 | 0 |
| | 0 1 $x_0$ | 1..2 |
| | 0 0 1 $x_1$ $x_0$ | 3..6 |
| | 0 0 0 1 $x_2$ $x_1$ $x_0$ | 7..14 |
| | ...... | ...... |
| k = 1 | 1 $x_0$ | 0..1 |
| | 0 1 $x_1$ $x_0$ | 2..5 |
| | 0 0 1 $x_2$ $x_1$ $x_0$ | 6..13 |
| | 0 0 0 1 $x_3$ $x_2$ $x_1$ $x_0$ | 14..29 |
| | ...... | ...... |
| k = 2 | 1 $x_1$ $x_0$ | 0..3 |
| | 0 1 $x_2$ $x_1$ $x_0$ | 4..11 |
| | 0 0 1 $x_3$ $x_2$ $x_1$ $x_0$ | 12..27 |
| | 0 0 0 1 $x_4$ $x_3$ $x_2$ $x_1$ $x_0$ | 28..59 |
| | ...... | ...... |
| k = 3 | 1 $x_2$ $x_1$ $x_0$ | 0..7 |
| | 0 1 $x_3$ $x_2$ $x_1$ $x_0$ | 8..23 |
| | 0 0 1 $x_4$ $x_3$ $x_2$ $x_1$ $x_0$ | 24..55 |
| | 0 0 0 1 $x_5$ $x_4$ $x_3$ $x_2$ $x_1$ $x_0$ | 56..119 |
| | ...... | ...... |

FIG. 20

| | |
|---|---|
| block( i ) { | |
|    if ( i < 6 && (MbCBP & ( 1 << i ))) { | |
|       cbp_4x4 | u(4) |
|       for ( j=0; j<4; j++ ) { | |
|          if ( cbp_4x4 & ( 1 << j ) ) { | |
|             do { | |
|                trans_coefficient_4 | ce4(v) |
|             } while ( trans_coefficient_4 != EOB ) | |
|          } | |
|       } | |
|    } | |
| } | |

DECODING METHOD AND ENCODING METHOD

CROSS REFERENCE TO RELATED APPLICATION

This application claims the benefit of U.S. Provisional Application No. 60/632,968, filed Dec. 6, 2004, the contents of which are herein incorporated by reference in its entirety.

BACKGROUND OF THE INVENTION (1) Field of the Invention

The present invention relates to an decoding method and an encoding method for decoding and encoding a variable length code using a table in which a code number corresponds to a Run symbol and a Level symbol.

(2) Description of the Related Art

Variable length coding method can be found in various standards such as JPEG, ISO/IEC 13818-2, ISO/IEC 14496-2 and ISO/IEC 14496-10. Some variable length coding methods in multimedia data coding requires the use of tables to decode a variable length code to a Run and a Level for the construction of block transform coefficients. Here, the Run is a symbol indicating the number of consecutive coefficients each having a value of zero in a block that includes quantized transform coefficients, and the Level is a symbol indicating a value of a non-zero coefficient that follows the Run.

For example, in some coding methods, two-dimensional variable length code (VLC) tables are used for decoding a single variable length code to a Run and a Level simultaneously. Such tables provide better compression than using one-dimensional VLC tables especially when the transform block size is small, for example, 4×4. FIGS. 1 to 18 show examples of two-dimensional VLC tables used in video coding standard to decode a variable length code to Run and Level information. FIG. 1 is a two-dimensional VLC table called VLC_Intra0. Furthermore, FIGS. 2 to 18 are two-dimensional VLC tables called VLC_Intra1, VLC_Intra2, VLC_Intra3, VLC_Intra4, VLC_Intra5, VLC_Intra6, VLC_Iner0, VLC_Inter1, VLC_Inter2, VLC_Inter3, VLC_Inter4, VLC_Inter5, VLC_Inter6, VLC_Chroma0, VLC_Chroma1, VLC_Chroma2, and VLC_Chroma3, respectively.

In the two-dimensional VLC tables, a pair of a Run and a Level corresponds to a code number (hereinafter, referred to also as CodeNum). In video encoding, the pair of a Run and a Level is transformed to a CodeNum based on the above VLC table, and such CodeNum is further transformed to a variable length code. Such a VLC table is called a code number table (CodeNum table).

An example of the variable length coding method using the two-dimensional CodeNum table is described as follows. In FIG. 1, the entries indicate the values of CodeNum. The rows indicate the values of Run corresponding to the CodeNum while the columns indicate the absolute values of Level corresponding to the CodeNum. For example, Run with a value of 1 and Level with a value of 2 will give a CodeNum of 18. Furthermore, CodeNum corresponding to Level with negative values can be obtained using the same table. For example, Run with a value of 1 and Level with a value of −2 will give a CodeNum of 19 (18+1=19). That is because a value of each CodeNum plus 1 in the table is a CodeNum corresponding to each Level with a negative value. In the table, even CodeNum indicate positive Level and odd CodeNum that are not found in the table indicate negative Level.

Furthermore, the CodeNum in the table can be encoded to an Exponential-Golomb (Exp-Golomb) code and vice versa. FIG. 19 shows examples of k-type Exp-Golomb codes. Exp-Golomb codes are variable length codes where the length of the prefix bits and the length of the suffix bits follow a fixed relationship. The prefix bits are bits before the first "1" bit reading from the most significant bit to the least significant bit. The suffix bits are bits after the first "1" bit reading from the most significant bit to the least significant bit. Thus, as shown in FIG. 19, for the k-type Exp-Golomb code, the length of the suffix bits is equal to the length of the prefix bits plus k.

One conventional art for representing Run and Level information that are not present in the CodeNum tables is to use CodeNum greater than the maximum value specified in the CodeNum table to represent the Run values only. The information regarding Sign of the Level information is carried with the CodeNum table as well and a CodeNum corresponding to a positive Level plus 1 represents a CodeNum corresponding to negative Level. The second variable length code following the current variable length code represents an Exp-Golomb code to indicate the absolute value of the Level. If decoded Run information is less than the maximum value of Run indicated in the CodeNum table, a value of encoded Level value is a difference between actual Level and the maximum value of Level plus 1. Else, the encoded Level value is a difference between an absolute value of Level and one.

FIG. 20 shows a syntax of another conventional art for writing an end of block (EOB) symbol of a 4×4 block. If the 4×4 block is encoded, all the transform coefficients are not zero. As shown in FIG. 20, the transform coefficients are decoded until the decoded symbol indicates that an EOB symbol is present. Thus the last symbol of the block has to be an EOB symbol.

The conventional arts as described above have the following problems to be solved. The first problem for the first conventional art to be solved is that some redundancy is introduced into the variable length coding as not all the values of CodeNum resulting in the same bit numbers are fully assigned to the CodeNum table. For example, if the maximum possible value for Run is 15, the largest value for CodeNum will be 37+30=67 as shown in FIG. 1. And to represent this CodeNum, a 12 bit variable length code is needed for k=1 type Exp-Golomb Code, for example, "000001000101". Thus, since the CodeNum "000001000101" corresponds to a maximum Run, the 12 bit codes from "000001000110" to "000001111111" are never used, so that some redundancy is introduced into the coding method.

The second problem for the first conventional art is that sometimes the value of Level is very large and the size of the second variable length code can be also quite large. For this case, the coding efficiency is decreased.

The problem with the second conventional art is redundancy resulted from that the last variable length code of the block always has to be the EOB symbol. If the last coefficient of the block is not zero, an end of the block can be determined by counting coefficients that are not yet decoded in the block and determining the counted number is zero, so that it is possible to determine, without using the EOB, that a currently decoding coefficient is the last coefficient in the block, so that the EOB is redundant and decreases the coding efficiency.

SUMMARY OF THE INVENTION

An object of the present invention is to provide a decoding method and an encoding method for decoding and encoding variable length codes, by which efficiency in the coding is increased.

To solve the above problems, a decoding method according to the present invention for decoding a variable length code to a Run symbol and a Level symbol using a table in which a code number corresponds to the Run symbol and the Level symbol, the Run symbol indicating the number of consecutive coefficients each having a value of zero, and the Level symbol indicating a value of a non-zero coefficient following the Run symbol, the decoding method includes: decoding a variable length code to a code number; determining whether the code number obtained in the decoding belongs to a first range or a predetermined range; decoding the code number to a Run symbol and a Level symbol by referring to the table, when it is determined that the code number belongs to the first range; and decoding the code number to a Level symbol and then decoding a variable length code following the decoded variable length code to obtain a Run symbol, without referring to the table, when it is determined that the code number belongs to the predetermined range.

Here, the first range includes code numbers that exist in the table, and the predetermined range includes code numbers that are larger than the code numbers in the first range.

With the above method, in the table indicating the code numbers as Escape Codes, a single code number in the first range corresponds to both of a Run symbol and a Level symbol. On the other hand, another single code number in the predetermined range (hereinafter, referred to as a type-2 Escape Code) corresponds to only a Level symbol, and a Run symbol is encoded to another variable length code. Thereby it is possible to increase the coding efficiency.

Here, the determining may further include determining whether or not the code number belongs to a second range, wherein the second range includes code numbers that are larger than the code numbers in the first range (hereinafter, referred to as a type-1 Escape Code), and the predetermined range is a third range that includes code numbers that are larger than the code numbers in the second range, and the decoding may further includes decoding the code number to a Run symbol and a Level symbol by indirectly referring to the table, when it is determined that the code number belongs to the second range.

With the above method, it is possible to decode not only the code numbers in the first range but also the code numbers in the second range by indirectly using the table. Thereby it is possible to use the code numbers in the second range as the type-1 Escape Codes.

Here, the code numbers in the second range may continue from the code numbers in the first range, and the code numbers in the third range may continue the code numbers in the second range.

Here, the number of the code numbers in the second range may be equal to the two times value of the number of coefficients in a block.

Here, the determining may include: comparing the code number with a maximum code number in the table; determining that the code number belongs to the first range, when the code number is equal to or less than the maximum code number; comparing the code number with the summed value of the maximum code number and two times value of the number of coefficients in a block; determining that the code number belongs to the second range, when the code number is larger than the maximum code number and equal to or less than the the summed value of the maximum code number and two times value of the number of coefficients in a block; and determining that the code number belongs to the third range, when the code number is larger than the summed value of the maximum code number and two times value of the number of coefficients in a blocks.

Here, the decoding method according to the present invention may further include: determining whether or not a code following the decoded variable length code is an EOB symbol indicating an end of a block; counting the number of decoded coefficients; determining whether or not the counted number reaches the number of coefficients in the block; and ending decoding of the block even if the EOB symbol is not detected, when it is determined that the counted number reaches the number of the coefficients.

Furthermore, an encoding method according to the present invention for encoding a Run symbol and a Level symbol to a variable length code using a table in which a code number corresponds to the Run symbol and the Level symbol, the Run symbol indicating the number of consecutive coefficients each having a value of zero, and the Level symbol indicating a value of a non-zero coefficient following the Run symbol, the encoding method includes: deciding the Run symbol and the Level symbol; determining whether the Run symbol and the Level symbol belong to a first range or and a predetermined range; obtaining a code number corresponding to the Run symbol and the Level symbol by referring to the table and encoding the obtained code number to a variable length code, when it is determined that the Run symbol and the Level symbol belong to the first range; and encoding the Level symbol to a variable length code and encoding the Run symbol to another variable length code, without referring to the table, when it is determined that the Run symbol and the Level symbol belong to the predetermined range, wherein the first range includes Run and Level symbols that exist in the table, and the predetermined range includes Run and Level symbols corresponding to code numbers that are larger than code numbers corresponding to the Run and Level symbols in the first range.

Here, the determining may further include determining whether the Run symbol and the Level symbol belong to the second range, wherein the second range includes the Run and Level symbols corresponding to code numbers that are larger than the code numbers corresponding to the Run and Level symbols in the first range, and the predetermined range is a third range that includes Run and Level symbols corresponding to code numbers that are larger than the code numbers corresponding to the Run and Level symbols in the second range, and the encoding method may further includes calculating a code number corresponding to the Run symbol and the Level symbol by indirectly referring to the table and encoding the calculated code number to a variable length code, when it is determined that the Run symbol and the Level symbol belong to the second range.

Here, the code numbers corresponding to the Run and Level symbols in the second range may continue from the code numbers corresponding to the Run and Level symbols in the first range, and the code numbers corresponding to the Run and Level symbols in the third range may continue from the code numbers corresponding to the Run and Level symbols in the second range.

Here, the number of the code numbers corresponding to the Run and Level symbols in the second range may be equal to the number of the code numbers corresponding to the Run and Level symbols in the second range.

Here, the determining may include: comparing the Run symbol with a maximum Run symbol in the table; comparing the Level symbol with a maximum Level symbol in the table; determining that the Run symbol and the Level symbol belong to the first range, when the Run symbol is equal to or less than the maximum Run symbol and the Level symbol is equal to or less than the maximum Level symbol; comparing a difference between the Level symbol and the maximum Level symbol with a predetermined value, when the Run symbol is not equal to nor less than the maximum Run symbol or the Level symbol is not equal to nor less than the maximum Level symbol; determining that the Run and Level symbols belong to the second range, when the difference is equal to the predetermined value; and determining that the Run symbol and the Level symbol belong to the third range, when the difference is not equal to the predetermined value.

Here, the predetermined value may be 1.

Here, the encoding method according to the present invention may further includes: counting the number of encoded coefficients; determining whether or not the currently encoded coefficient is a last non-zero coefficient in a block; determining whether or not the counted number of the coefficient reaches the number of all coefficients in the block, when it is determined that the currently encoded coefficient is the last non-zero coefficient; encoding an EOB symbol indicating an end of an encoded sequence indicating a single block, when it is determined that the counted number of the coefficients does not reach the number of all coefficients in the block; and eliminating the encoding of the EOB symbol, when it is determined that the counted number of the coefficients reaches the number of all coefficients in the block.

Still further, a decoding apparatus and an encoding apparatus according to the present invention include the same characteristics as described for the above decoding and encoding methods.

Still further, an image data which is encoded and readable by a computer, the image data includes a variable length code sequence which indicates a Run symbol and a Level symbol, wherein a variable length code indicates a code number in a table in which the code number corresponds to the Run symbol and the Level symbol, and the variable length code sequence includes: a variable length code which indicates a code number in a first range; a variable length code which indicates a code number in a second range; and a variable length code which indicates a code number in a third range, and wherein the first range includes code numbers that exist in the table, the second range includes code numbers that are larger than the code numbers in the first range, and the third range includes code numbers that are larger than the code numbers in the second range.

Here, the variable length code sequence may include: an EOB symbol which indicates an end of a code sequence indicating an end of a single block and follows a last non-zero coefficient in the block, when an encoded coefficient is a last non-zero coefficient and is not a last coefficient in the block; and a code that is not the EOB symbol and is positioned immediately subsequent to the non-coefficients, when the encoded coefficient is the last non-zero coefficient and the last coefficient in the block.

As described above, a new method is proposed to encode the Run and Level symbols using the code numbers as the Escape Codes. What is novel about the present invention is that the present invention uses redundant variable length codes in the variable length tables to indicate the existence of two types of Escape Codes as well as to represent the values of the Run and Level. For the type-1 Escape Codes, the present invention uses these Escape Codes to represent value of Run and the value of Level concurrently. For the type-2 Escape Codes, the present invention uses these Escape Codes to represent the values of Level and indicates the presence of a second variable length code to indicate the value of Run. The code numbers in the second range are the type-1 Escape Codes, and the code numbers in the third range are the type-2 Escape Codes.

Moreover, to solve the redundancy problem for the EOB symbol, an additional condition is checked to see such a symbol is required. The decision to code this EOB symbol is based on the number of previously decoded coefficients of the block.

The effect of the present invention is to signalize the Escape Codes in order to represent Run and Level symbols more efficiently. The effect is evident in the form of better coding efficiency of variable length codes.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings:

FIGS. 1 to 18 show examples of two-dimensional VLC tables used in video coding standards to decode Run and Level;

FIG. 19 shows examples of k-type Exp-Golomb codes;

FIG. 20 shows a syntax of the conventional art for writing an EOB symbol of a 4×4 block;

DESCRIPTION OF THE PREFERRED EMBODIMENT(S)

Figure 21:
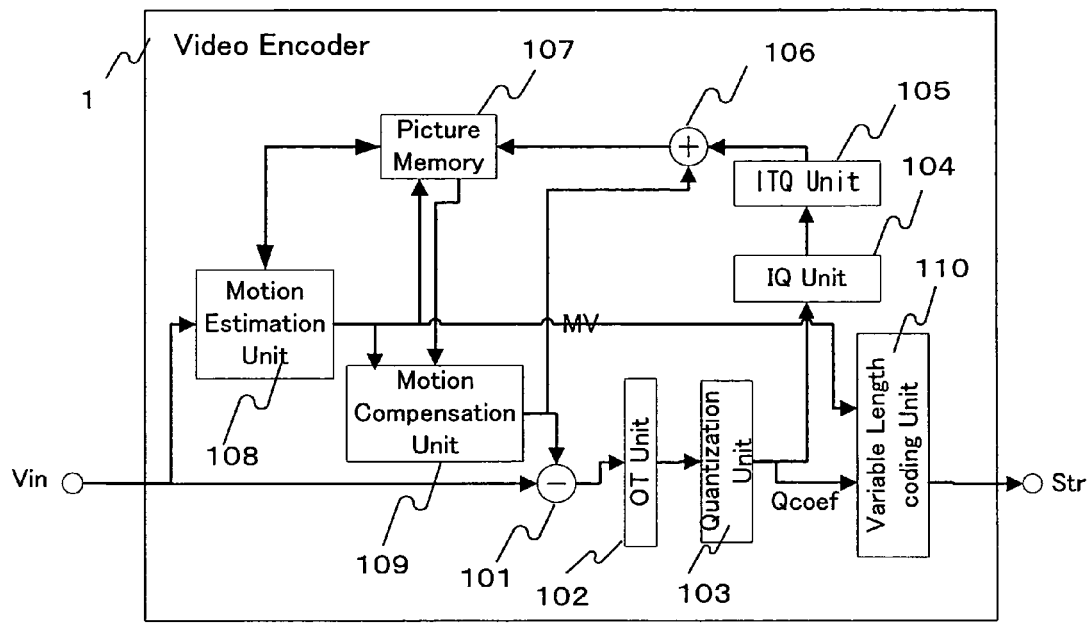
FIG. 21 is a block diagram showing a structure of a video encoding apparatus according to a preferred embodiment of the present invention.

FIG. 21 is a block diagram showing a structure of a video encoding apparatus according to a preferred embodiment of the present invention. In FIG. 21, a video encoding apparatus 1 is an apparatus which applies compression coding to an inputted video signal Vin in order to transform the signal to a bitstream such as a variable length code and outputs the stream as an encoded video signal Str. The video encoding apparatus 1 includes a compression coding subtractor 101, an orthogonal transform unit 102, a quantization unit 103, an inverse quantization unit 104, an inverse orthogonal transform unit 105, an adder 106, a picture memory 107, a motion estimation unit 108, a motion compensation unit 109 and a variable length coding unit 110. A variable length coding method according to the present invention is performed by the variable length coding unit 110 in order to improve efficiency in the coding.

The video signal Vin is inputted into the subtractor 101 and the motion estimation unit 108. The subtractor 101 calculates in units of blocks a difference between the inputted video signal Vin and a predicted picture in order to generate a prediction error and then outputs the prediction error to the orthogonal transform unit 102. The orthogonal transform unit 102 applies orthogonal transformation to the prediction error in order to generate frequency coefficients and outputs the frequency coefficients to the quantization unit 103. The quantization unit 103 quantizes the inputted frequency coefficients and outputs the quantized coefficients Qcoef to the variable length coding unit 110 and the inverse quantization unit 104.

The inverse quantization unit 104 inversely quantizes the quantized coefficients Qcoef to obtain the frequency coefficients and outputs the obtained frequency coefficients to the inverse orthogonal transform unit 105. The inverse orthogonal transform unit 105 applies inverse frequency transformation to the frequency coefficients to obtain the prediction error and outputs the prediction error to the adder 106. The adder 106 adds the prediction error to the predicted picture which has been outputted from the motion compensation unit 109 in order to obtain a decoded picture. The decoded picture is stored as a reference picture in the picture memory 107.

Meanwhile, the motion estimation unit 108 receives the video signal Vin in units of macroblocks, then searches the decoded pictures stored in the picture memory 107 to detect the most similar image area to the inputted video signal Vin, and eventually determines a motion vector MV indicating a position of the image area.

The motion compensation unit 109 uses the motion vector to read the most suitable image to be predicted image from the decoded pictures stored in the picture memory 107.

The variable length coding unit 110 applies variable length coding to the quantized coefficients Qcoef, the motion vector MV, and the like to generate an encoded stream Str.

Here, the variable length coding unit 110 uses a code number table (CodeNum table) in which CodeNum correspond to Run and Level as shown in FIGS. 1 to 18 and an Exp-Golomb code table which is used to encode CodeNum to a variable length code as shown in FIG. 19. Note that the Run indicates the number of consecutive coefficients each having a value of zero in a block, and the Level indicates a value of a non-zero coefficient following the Run. The variable length coding unit 110 firstly determines Run and Level to be encoded, and then examines to which range the Level and Run belongs: the first range, the second range, or the third range. Note that the first range includes Run and Level symbols that exist in the CodeNum table. The first range also includes code numbers that exist in the CodeNum table. The second range includes Run and Level symbols corresponding to code numbers that are larger than the code numbers corresponding to the Run and Level symbols in the first range. The third range includes Run and Level symbols corresponding to code numbers that are larger than the code numbers corresponding to the Run and Level symbols in the second range.

Next, if a determination is made that the Run and Level belong to the first range, the variable length coding unit 110 refers to the CodeNum table to obtain a CodeNum corresponding to the Run and Level and encodes the obtained CodeNum to a variable length code.

If a determination is made that the Run and Level belong to the second range, the variable length coding unit 110 indirectly refers to the CodeNum table to calculate a CodeNum corresponding to the Run and Level and encodes the calculated CodeNum to a variable length code.

If a determination is made that the Run and Level belong to the third range, the variable length coding unit 110 encodes the Level to a variable length code and encodes the Run to another variable length code, without referring to the CodeNum table.

The values of CodeNum in the second range are the type-1 Escape Codes. This means that a single CodeNum represents both of a Run and a Level simultaneously. The values of CodeNum in the third range are the type-2 Escape Codes. This means that a Run and a Level is encoded separately. In this case, a Level is encoded to the first variable length code and a Run is encoded to the second variable length code.

Figure 22:
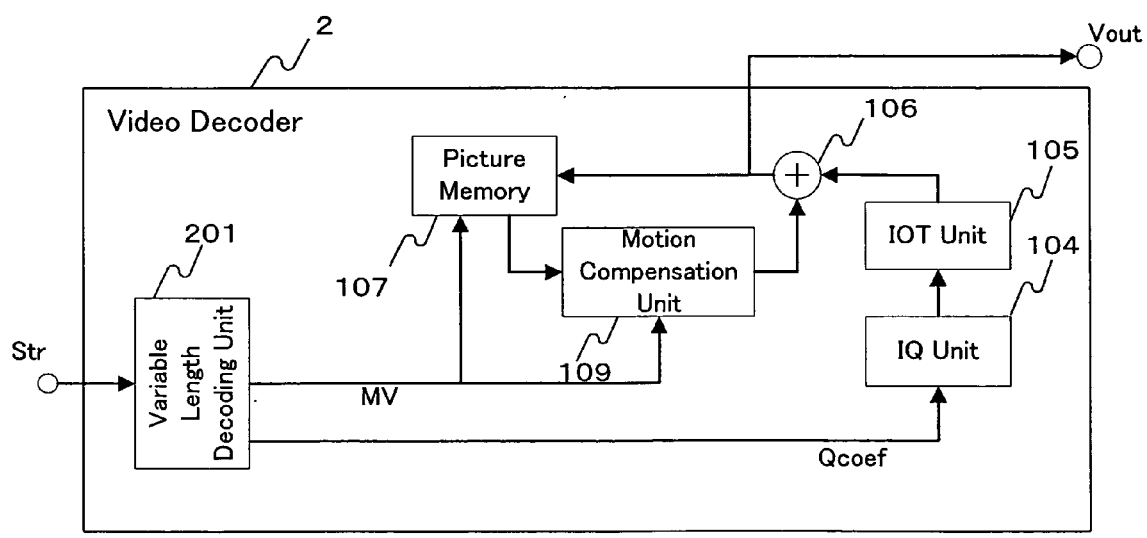
FIG. 22 is a block diagram showing a structure of a video decoding apparatus according to the preferred embodiment of the present invention.

FIG. 22 is a block diagram showing a structure of a video decoding apparatus according to the embodiment of the present invention. Note that the reference numerals in FIG. 21 are assigned to identical units in FIG. 22 so that the operations performed by those units are same as described above. The variable length decoding method according to the present invention is performed by a variable length decoding unit 201.

The variable length decoding unit 201 decodes the encoded stream Str and outputs the obtained quantized coefficients Qcoef and the motion vector MV. The quantized coefficients Qcoef and the motion vector MV are inputted into the picture memory 107, the motion compensation unit 109 and the inverse quantization unit 104 to be decoded. The operation is the same as described for the video encoding apparatus of FIG. 21.

Here, the variable length decoding unit 201 uses the Exp-Golomb code table as shown in FIG. 19 and the CodeNum table in which CodeNum correspond to Run and Level as shown in FIGS. 1 to 18. Firstly, the variable length decoding unit 201 decodes a variable length code to a CodeNum using the Exp-Golomb code table, and examines to which the obtained CodeNum belongs: the first range, the second range, or the third range.

Next, if a determination is made that the obtained CodeNum belongs to the first range, the variable length decoding unit 201 decodes the decoded CodeNum to a Run and a Level by directly referring to the CodeNum table. If a determination is made that the obtained CodeNum belongs to the second range, the variable length decoding unit 201 decodes the CodeNum to a Run and a Level by indirectly referring to the CodeNum table. If a determination is made that the obtained CodeNum belongs to the third range, the variable length decoding unit 201 decodes the CodeNum in order to obtain a value of Level (an absolute level difference (AbsLevelDiff) derived from a below-described Run) and decodes another variable length code that follows the decoded variable length code in order to obtain a Run, without referring to the table. Note that the first range includes code numbers that exist in the table. Note also that the second range includes code numbers that are larger than the code numbers in the first range. The second range may continue from the CodeNum in the first range. The number of the code numbers in the second range may be equal to the number of the code numbers in the first range. Note also that the third range includes code numbers that are larger than the code numbers in the second range.

Furthermore, the variable length decoding unit 201 examines whether or not a code following the decoded variable length code is an EOB symbol indicating an end of a block, then counts the number of the decoded coefficients, and determines whether or not the counted number reaches the number of coefficients included in a single block. If a determination is made that the counted number reaches the number of coefficients, the variable length decoding unit 201 may end the decoding of the block even if the EOB symbol is not detected.

Figure 23:
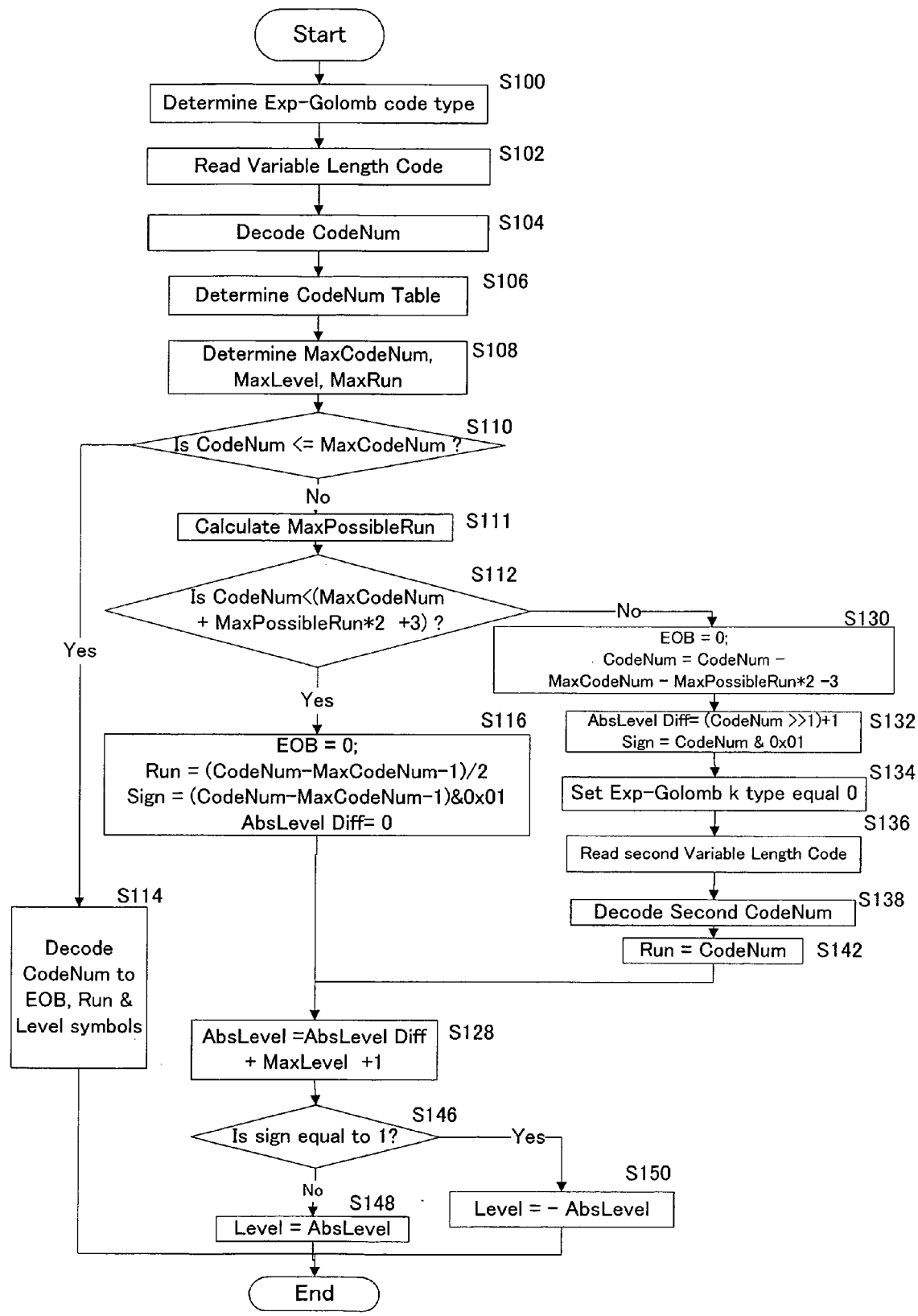
FIG. 23 is a flowchart showing decoding of a variable length code to an EOB symbol, a Run symbol, and a Level symbol.

FIG. 23 is a flowchart showing the decoding performed by the variable length decoding unit 201 for decoding a variable length code to EOB, Run, and Level symbols. In FIG. 23, decoding of a CodeNum in the first range is shown as Step S114. Decoding of a CodeNum in the second range is shown as Steps S116, S128, S146, S148, and S150. Decoding of a CodeNum in the third range is shown as Steps S130, S132, S134, S136, S138, S142, S128, S146, S148, and S150.

Firstly, at Step S100, the type of Exp-Golomb variable length code used is determined. The type of Exp-Golomb code determines the relationship between a length of suffix bits and a length of prefix bits of the variable length code. The relationship is determined using a variable k where the length of the suffix bits is equal to the length of the prefix bits plus the variable k.

After the type of Exp-Golomb code used had been determined, at Step S102 the variable length code is read from the bitstream. Next at Step S104, from the read-out stream the Exp-Golomb code is decoded to obtain a CodeNum. At Step S106, a CodeNum table is selected to obtain Run and Level. The table is selected depending on whether the coefficients to be decoded have been applied with intra-picture coding or inter-picture coding, or on other information. At Step S108, variables MaxCodeNum, MaxLevel and MaxRun are determined based on the selected CodeNum table.

Note that MaxCodeNum represents a maximum CodeNum that exists in the selected CodeNum table. The table indicates positive values of Level, and CodeNum corresponding to negative values of Level are CodeNum corresponding to respective positive values of Level plus 1, so that an actual maximum CodeNum is the maximum CodeNum in the table plus 1. For example, each MaxCodeNum is equal to 37 in FIGS. 1, 8, and 15, and each MaxCodeNum is equal to 38 for the rest of the tables. In the case of FIGS. 1, 8 and 15, the variable length code for the MaxCodeNum using k=1 type Exp-Golomb code is "0000100111".

MaxLevel represents a maximum value of Level indicated by the table for a corresponding value of Run. For example, in FIG. 1, when a value of Run is equal to zero, the MaxLevel is equal to 4. For values of Run that are not found in the table, MaxLevel shall have a value of zero.

MaxRun represents a maximum value of Run indicated by the table. In FIG. 1 case, the MaxRun is equal to the value 9.

Next, at Step S110, the obtained CodeNum is compared with a MaxCodeNum to see whether the CodeNum is equal to or less than the MaxCodeNum. If the CodeNum is equal to or less than the MaxCodeNum, then at Step S114 the CodeNum is decoded to obtain EOB or Run and Level information using the selected CodeNum table. It is assumed that if the obtained CodeNum is a CodeNum in the CodeNum table plus 1, a value of Level is negative, and on the other hand if the obtained CodeNum is equal to a CodeNum in the CodeNum table, the value of Level is positive.

If the CodeNum is greater than the MaxCodeNum, then at Step S111 a MaxPossibleRun is calculated using the following equations 1 and 2:

$$\text{MaxPossibleRun}=15-\text{PreviousRuns} \quad \text{(Equation 1) and}$$

$$\text{PreviousRuns}+=\text{CurrentRun}+1 \quad \text{(Equation 2)}.$$

MaxPossibleRun indicates a maximum possible value of the Run in a current block. PreviousRuns indicates the number of coefficients decoded in the current block. For example, in the case of 4×4 block size, MaxPossibleRun is 15. Here, PreviousRuns is zero for the first coefficient in the current block and CurrentRun is the decoded Run in the current block. The equation 2 is calculated every time a pair of Run and Level is decoded.

Next, at Step S112, the obtained CodeNum is compared with a value derived from MaxCodeNum and MaxPossibleRun.

If the obtained CodeNum is smaller than a total sum of MaxCodeNum, two times value of MaxPossibleRun and a value of three, a value of such CodeNum is classified as the type-1 Escape Code. At Step S116, the EOB has a value of zero, the obtained Run has a value of (CodeNum−MaxCodeNum−1)/2, the variable Sign has a value of (CodeNum−MaxCodeNum−1) & 0×01, and the AbsLevelDiff has a value of zero Note that "&" represents logical AND operation.

For the type-1 Escape Code, only one VLC code is required to represent both of a Run and a Level. On the other hand, if the obtained CodeNum is equal to or more than a total sum of MaxCodeNum, two times value of MaxPossibleRun and a value of three, then at Step S112, such CodeNum is classified as the type-2 Escape Code. For the type-2 Escape Code, the CodeNum represents only Run information. The EOB symbol has a value of zero. At Step S130, the obtained CodeNum is firstly updated using the following equation 5:

$$\text{CodeNum}=\text{CodeNum}-\text{MaxCodeNum}-\text{MaxPossibleRun}*2-3 \quad \text{(Equation 5)}.$$

Next at Step S132, AbsLevelDiff is calculated using the following equation 6 and the value of Sign has a value of CodeNum & 0×01. Note that "&" represents logical AND operation.

$$\text{AbsLevelDiff}=(\text{CodeNum}>>1)+1 \quad \text{(Equation 6)}$$

Next at Step S134, in order to decode a variable length code indicating Run, k=0 type Exp-Golomb codes are used. Then at Step 136, a next variable length code is read from the bitstream. At Step S138, the read-out variable length code is the Exp-Golomb code and is decoded to obtain a CodeNum. At Step 142, the value of Run is equal to the value of CodeNum.

At Step S128, the AbsLevel is calculated based on the following equation 4:

$$\text{AbsLevel}=\text{AbsLevelDiff}+1+\text{MaxLevel} \quad \text{(Equation 4)}.$$

Finally, if the obtained value of the Sign at Step S146 is zero, a value of Level is equal to AbsLevel at Step S148. On the other hand, if the obtained Sign is 1, the value of Level has a value equal to a negative value of AbsLevel at Step S150.

Note that, to reduce complexity necessary to calculate MaxPossibleRun, all coefficients in a block may be fixed to have a value of the number of all coefficients in the block minus 1. In this case, Step S111 can be eliminated.

Moreover, the present embodiment has described that the range is divided into the first range, the second range, and the third range, but the processing for the second range can be eliminated and the range can be divided only to the first range and the third range.

Figure 24:
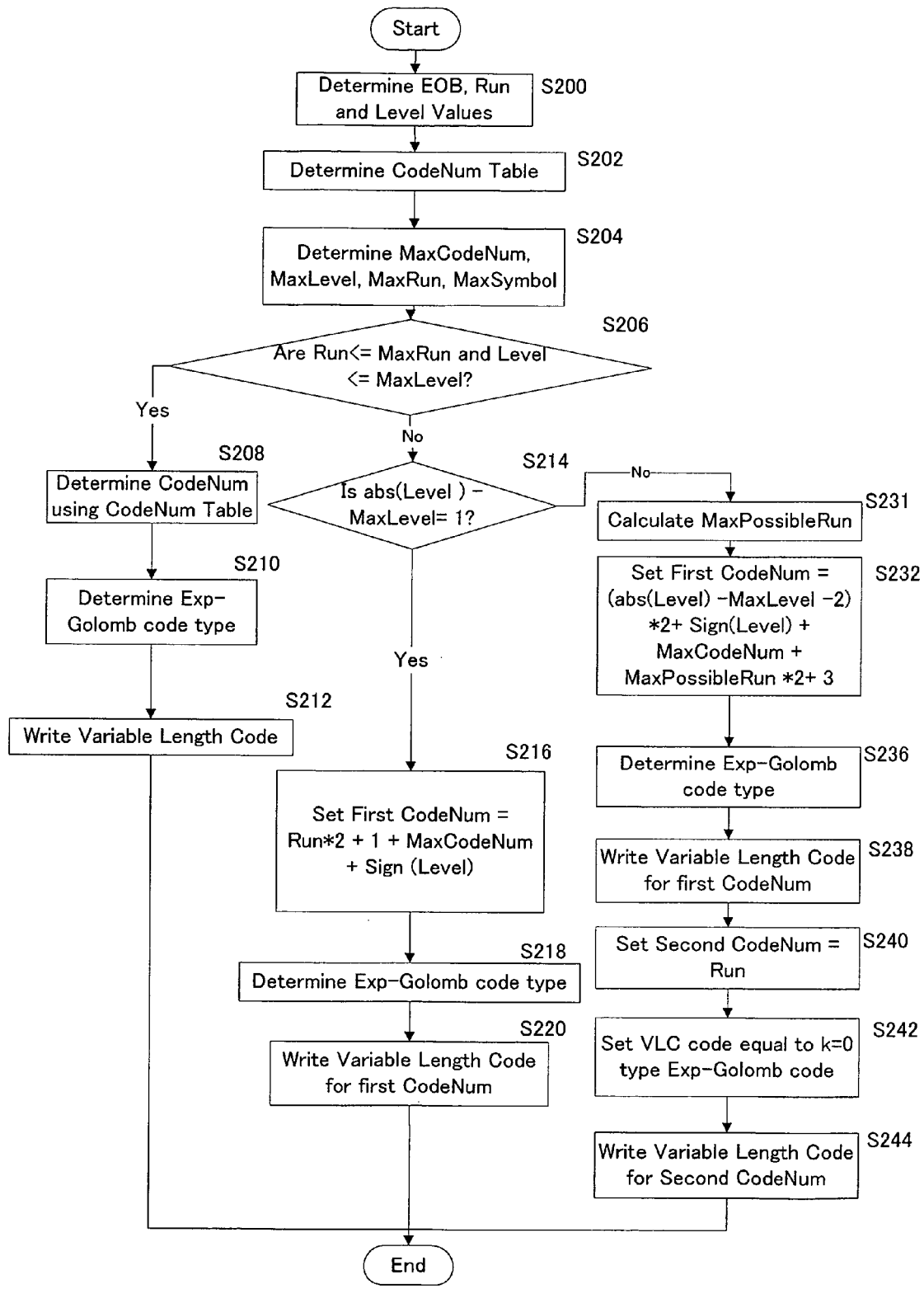
FIG. 24 is a flowchart showing encoding of an EOB symbol, a Run symbol, and a Level symbol to a variable length code.

FIG. 24 is a flowchart showing encoding of EOB information, Run information, and Level information to a variable length code. In FIG. 24, encoding of Run and Level in the first range is shown as Steps S208, S210, and S212. Encoding of Run and Level in the second range is shown as Steps S216, S218, and S220. Encoding of Run and Level in the third range is shown as S231, S232, S236, S238, S240, S242, and S244.

Firstly, at Step S200, for each non-zero coefficient, the EOB, Run and Level values for this coefficient are determined. Next at Step S202, a CodeNum table is selected to encode those information. At Step S204, based on the CodeNum table, variables of MaxCodeNum, MaxLevel and MaxRun are determined. MaxCodeNum represents a maximum CodeNum that exists in the CodeNum table. MaxLevel represents a maximum absolute value of Level corresponding to Run in the CodeNum table. MaxRun represents a maximum value of Run that exists in the CodeNum table. For example, in FIG. 1, when a value of Run is equal to zero, the MaxLevel is equal to 4. For values of Run that are not found in the table, MaxLevel shall have a value of zero.

Next, at Step S206, the value of Run and the absolute value of Level are compared with the values of MaxRun and MaxLevel. If both the value of Run and the absolute value of Level are equal or lower than the values of MaxRun and MaxLevel, respectively, then at Step S208, based on the EOB, Run and Level, a CodeNum is determined from the CodeNum table. At Step S210 the type of Exp-Golomb code to be used is selected. At Step S212 the Exp-Golomb code corresponding to the CodeNum is written in a stream.

If the condition that the value of Run and the absolute value of Level are equal to or lower than the values of MaxRun and MaxLevel, respectively, is not true, then at Step S214 the absolute value of Level alone is compared with the value of MaxLevel.

If a difference between the absolute value of Level and the value of MaxLevel is not equal to 1 at Step 5214, then at Step S231 MaxPossibleRun is derived. The MaxPossibleRun is calculated using the equation 1 or fixed as a value of maximum counted number of coefficients in the current block minus one.

At Step S232, the first CodeNum is calculated using the following equation 7:

$$CodeNum=(abs(Level)-MaxLevel-2)*2+Sign(Level)+MaxCodeNum+MaxPossibleRun*2+3 \quad \text{(Equation 7)},$$

where abs(Level) gives the absolute value of Level and sign (Level) gives a 1 if Level is negative and zero if Level is positive.

Next at Step S236, the type of Exp-Golomb code is selected. At Step S238, based on the selected Exp-Golomb code, the variable length code for the first CodeNum is written. Next at Step S240, the second CodeNum is set to the value of Run. At Step S242, the second CodeNum is encoded using k=0 type Exp-Golomb code and eventually obtained variable length code is written in a stream.

On the other hand, if at Step S214 the difference between the absolute value of Level and the value of MaxLevel is equal to 1, then at Step S216 the value of the CodeNum is calculated using the following equation 8:

$$CodeNum=Run*2+MaxCodeNum+1+Sign(Level) \quad \text{(Equation 8)},$$

where Sign (Level) is equal to zero if Level is positive and Sign(Level) is equal to 1 if Level is negative.

At Step S218, the type of Exp-Golomb code to be used is selected. Subsequently at Step S220, the CodeNum is encoded using the selected type of Exp-Golomb code, and the eventually obtained variable length code is written in a stream.

Figure 25:
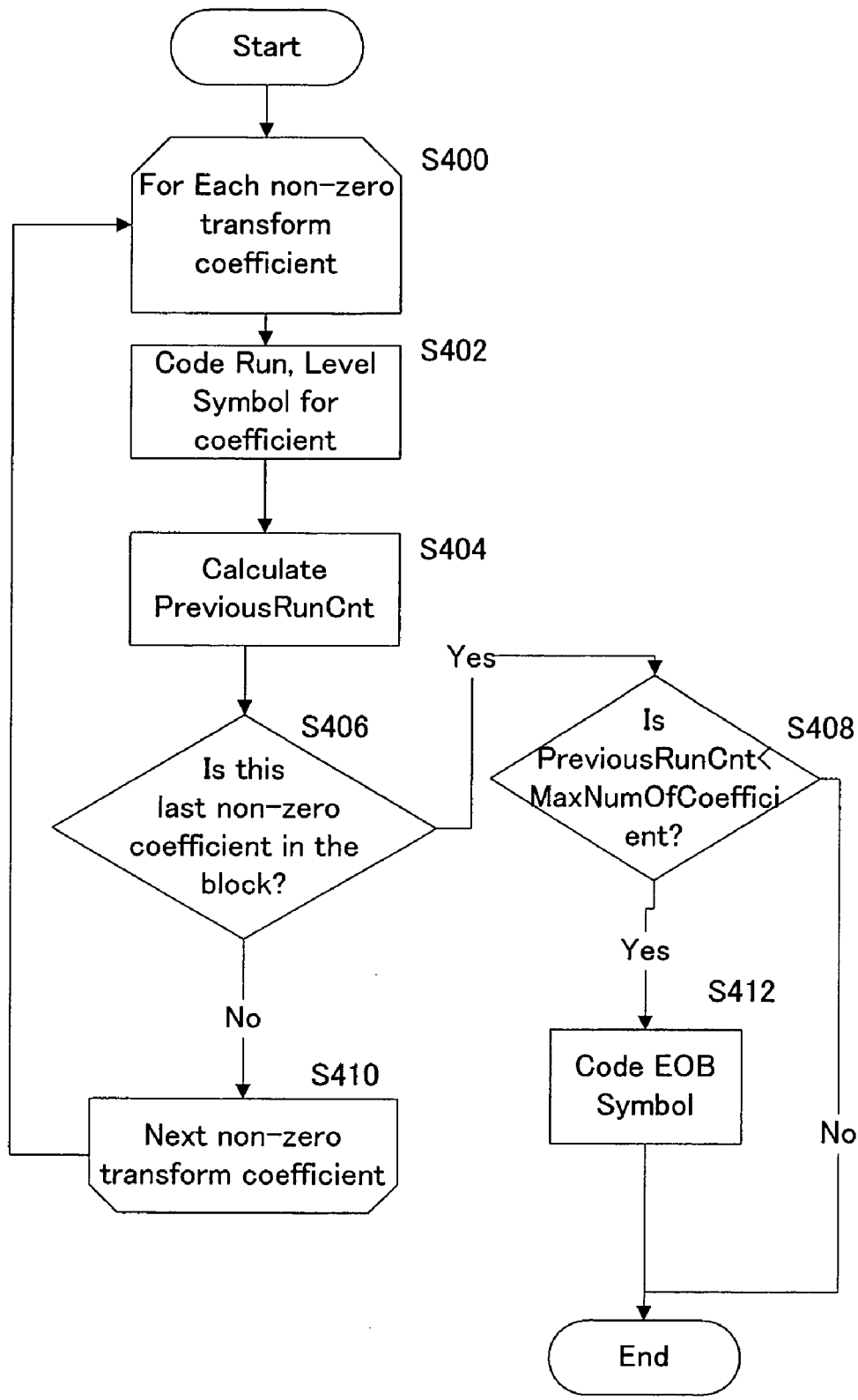
FIG. 25 is a flowchart showing encoding of an EOB symbol in a block according to the present invention.

FIG. 25 is a flowchart showing the signalizing of an EOB symbol for a block that includes non-zero transform coefficients, according to the present invention. Firstly at Step S402, the Run and Level information for each coefficient are encoded. Next at Step S404, a variable PreviousRunCnt is calculated using the following equation 11:

$$PreviousRunCnt+=CurrentRun+1 \quad \text{(Equation 11)},$$

where PreviousRunCnt is set to zero initially before encoding the first non-zero transform coefficient of the block and CurrentRun has the value of encoded Run.

At Step S406, a position of the transform coefficient is checked whether the transform coefficient is the last non-zero coefficient in the block. If the transform coefficient is not the last coefficient, the next non-zero transform coefficient will be processed at Step S410. If at Step S406, the transform coefficient is found to be the last non-zero coefficient, then at Step S408 the value of PreviousRunCnt is compared with the value of a maximum number of the coefficients (MaxNumOfCoefficient). MaxNumOfCoefficient has the value of 16 in the case of 4×4. This variable indicates the maximum possible number of coefficient in the block. If the value of PreviousRunCnt is less than MaxNumOfCoefficient at Step S408, then at Step S412 the EOB symbol is encoded in the bitstream. However, if the value of PreviousRunCnt is not less than MaxNumOfCoefficient at Step S408, the EOB symbol will not be encoded in the bitstream.

Figure 26:
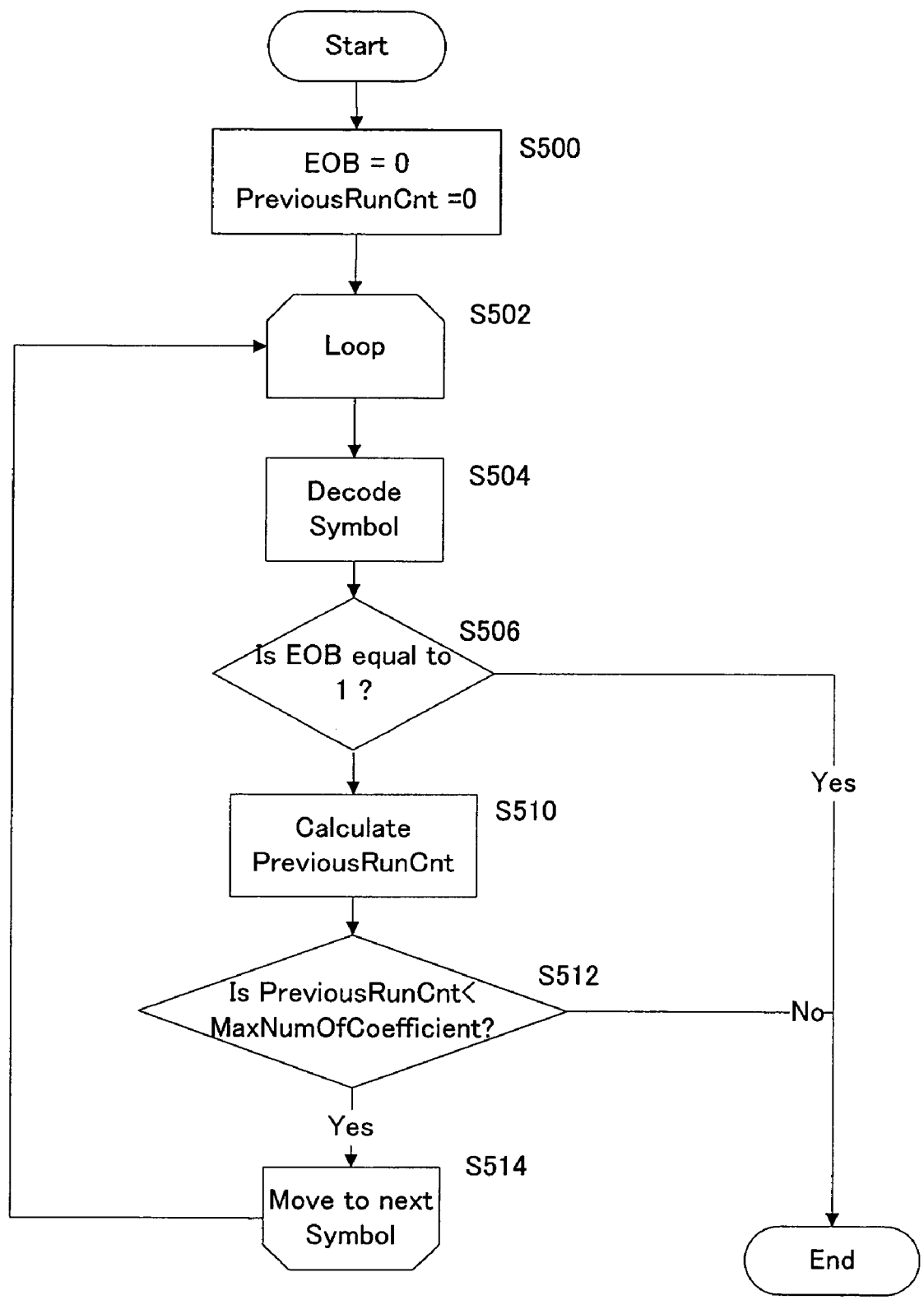
FIG. 26 is a flowchart showing decoding of an EOB symbol in a block according to present invention.

FIG. 26 is a flowchart showing the decoding of an EOB symbol in a block that includes non-zero transform coefficients, according to present invention. Firstly at Step S500, the variable EOB is set to zero and the variable PreviousRunCnt is set to zero. Next at Step S504, a CodeNum is decoded, and then Run, Level and EOB symbols are decoded from the decoded CodeNum. At Step S506, the decoded EOB information is compared whether the EOB is equal to a value of 1. If the EOB is equal to 1, all the non-zero transform coefficients for the current block are successfully decoded. If the EOB is not equal to 1 at Step S506, then at Step S510 PreviousRunCnt is calculated based on the equation 10. If PreviousRunCnt is less than MaxNumOfCoefficient at Step S512, the next code of the current block is decoded. Otherwise, if PreviousRunCnt is not less than MaxNumOfCoefficient, all the non-zero transform coefficients for the current block are decoded successfully, so that the processing completes.

As described above, the encoded stream Str generated by the variable length coding unit 110 of the present invention is computer-readable encoded video data and includes a variable length code sequence that indicates Run and Level. This variable length code sequence includes variable length codes belonging to the above first range, variable length codes belonging to the above second range, and variable length codes belonging to the above third range. If an encoded coefficient is the last non-zero coefficient in a block but not the last coefficient in the block, the variable length code sequence includes an EOB symbol indicating an end of the block immediately subsequent to the non-zero coefficients. On the other hand, if the encoded coefficient is the last non-zero coefficient in the block and the last coefficient in the block, the variable length code sequence will not include an EOB symbol immediately subsequent to the non-zero coefficients. Thereby it is possible to improve the efficiency in coding the variable length code sequence included in the encoded stream Str.

FIGS. 27 to 31 are graphs showing results of comparing a stream encoded by the encoding method according to the present invention with streams encoded by the encoding methods according to the conventional arts. In FIGS. 27 to 31, each horizontal axis represents coding bitrate. Each vertical axis psnr represents peak signals to ratio [dB] to indicate image quality (definition) of a compressed video. The greater a value of psnr becomes, the more the image quality is improved and the original video is recovered with higher fidelity. Modified AVS1.0 denotes an encoded stream generated by the encoding method according to the present invention. AVS-M and AVS1.0 denote encoded streams generated by the encoding methods according to the conventional arts. The AVS-M and AVS1.0 conform to respective moving picture coding standards.

Figure 27:
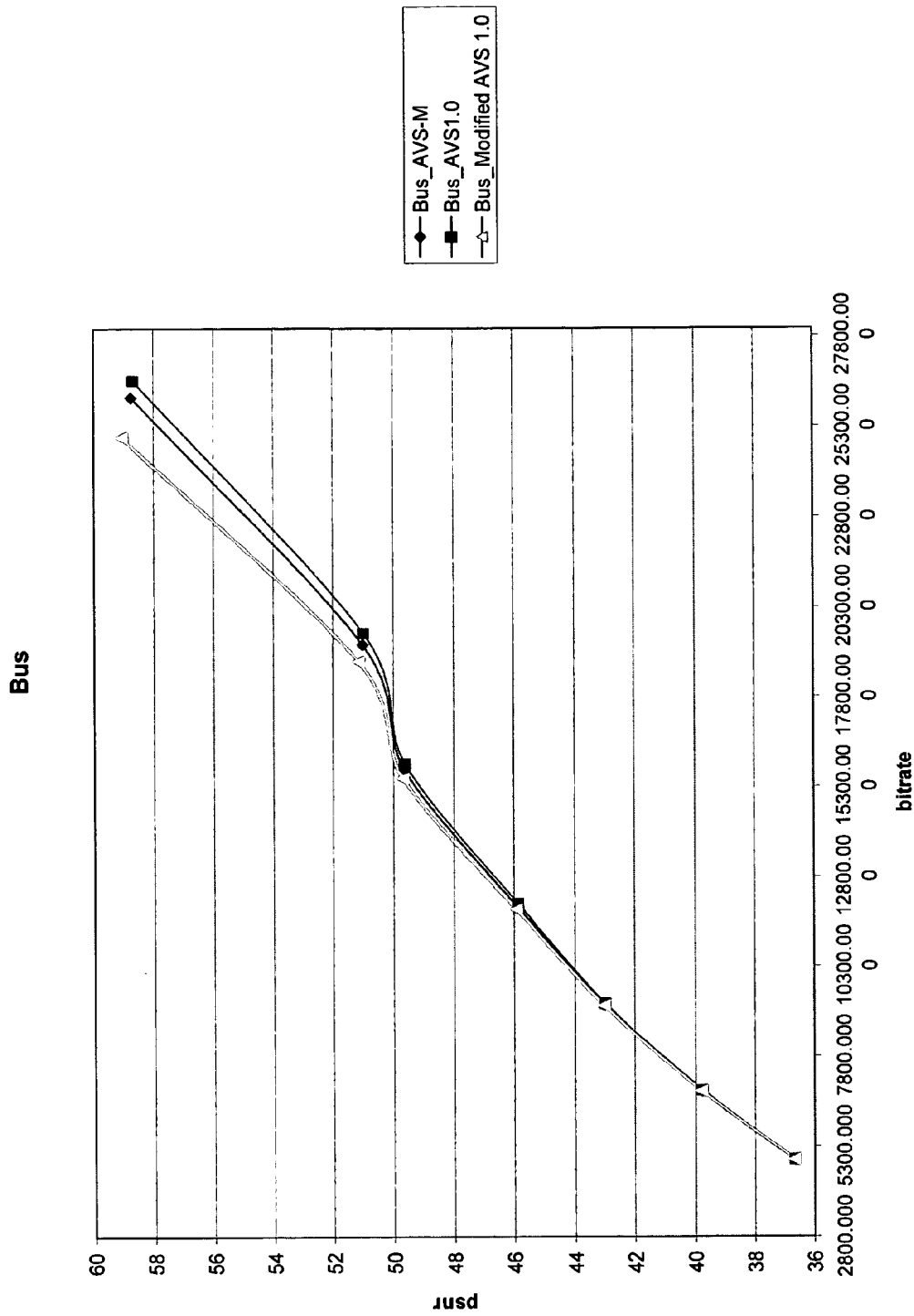
FIGS. 27 to 31 are graphs showing results of comparing a stream encoded by the encoding method according to the present invention with streams encoded by the encoding methods according to the conventional arts.
Figure 28:
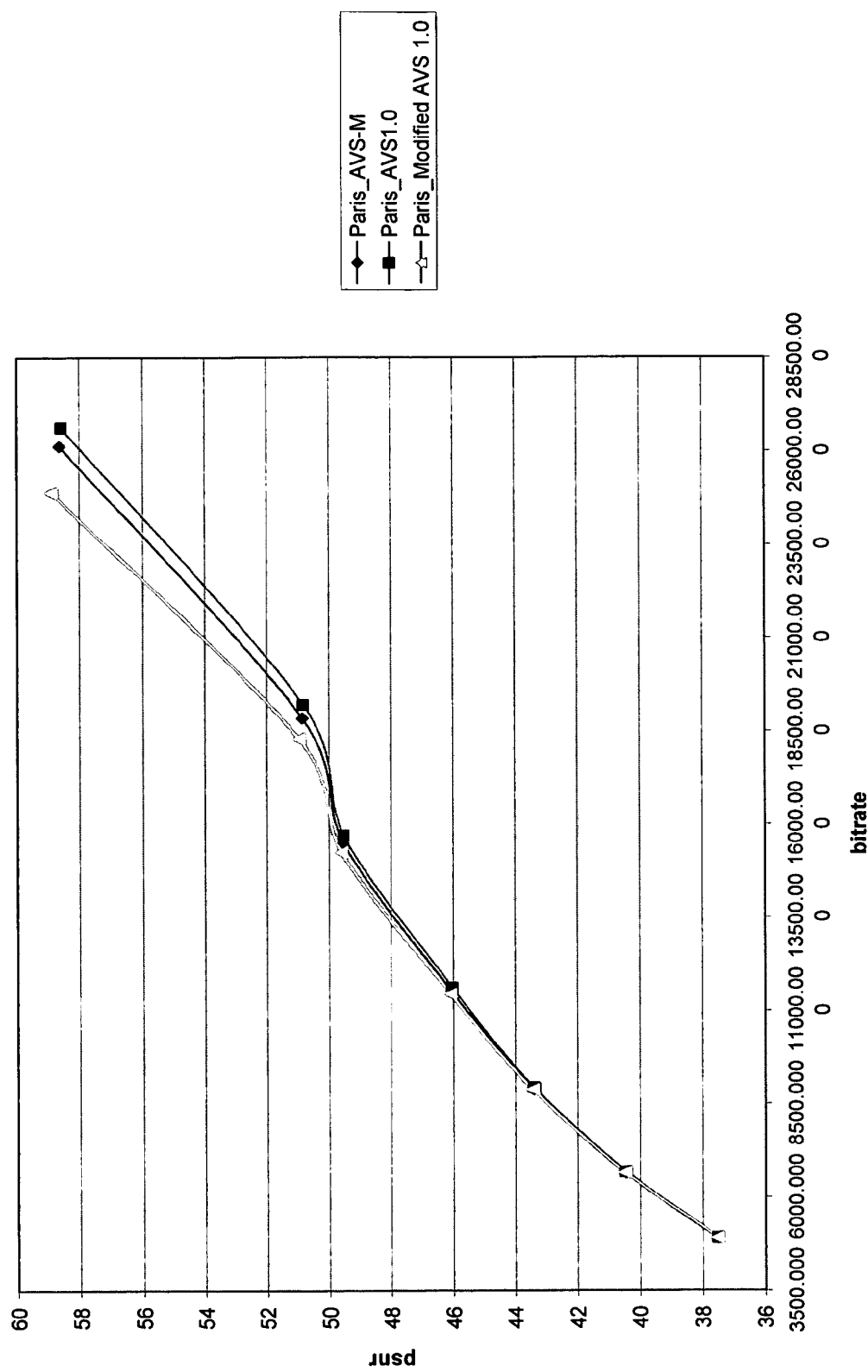
Figure 29:
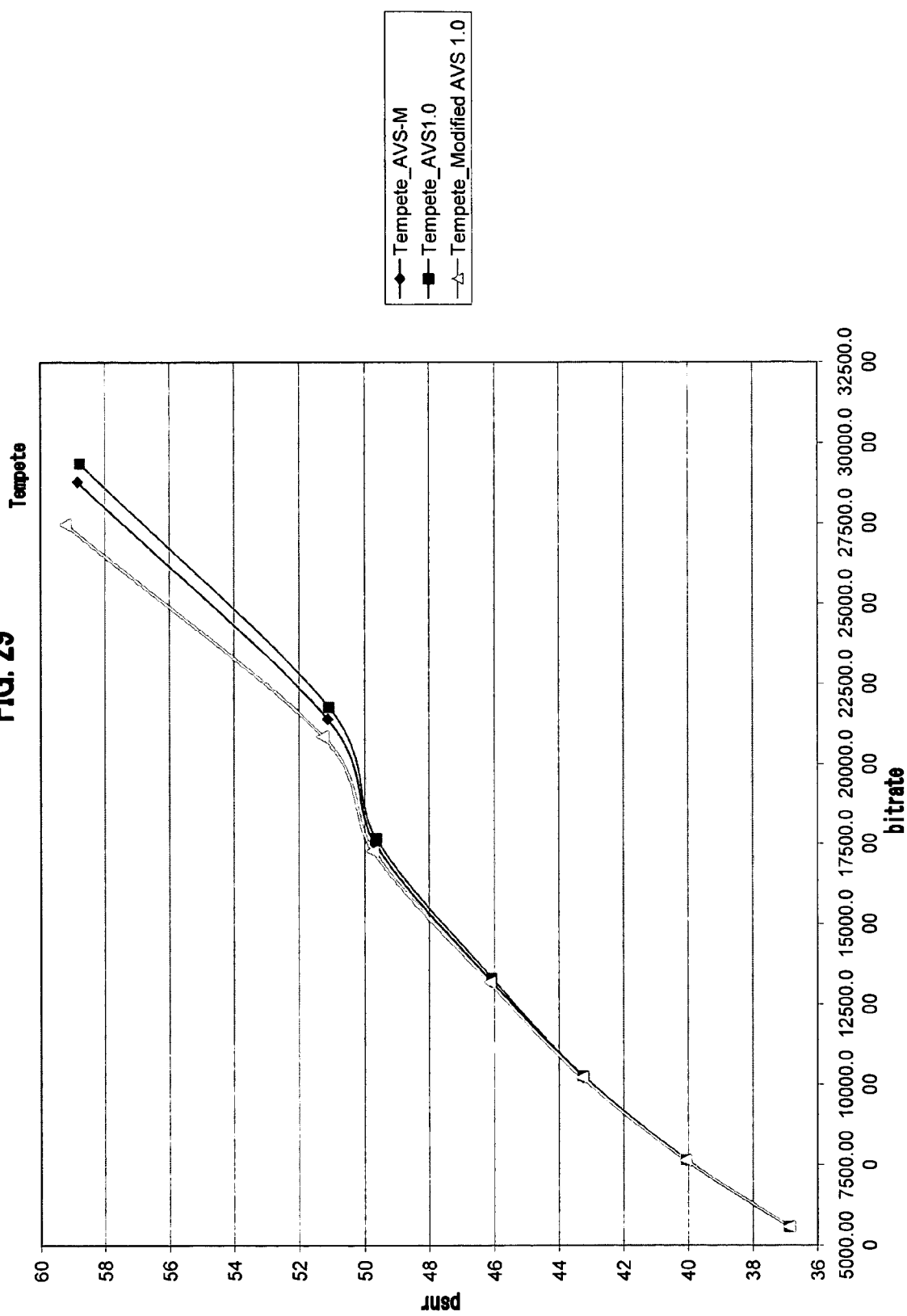
Figure 30:
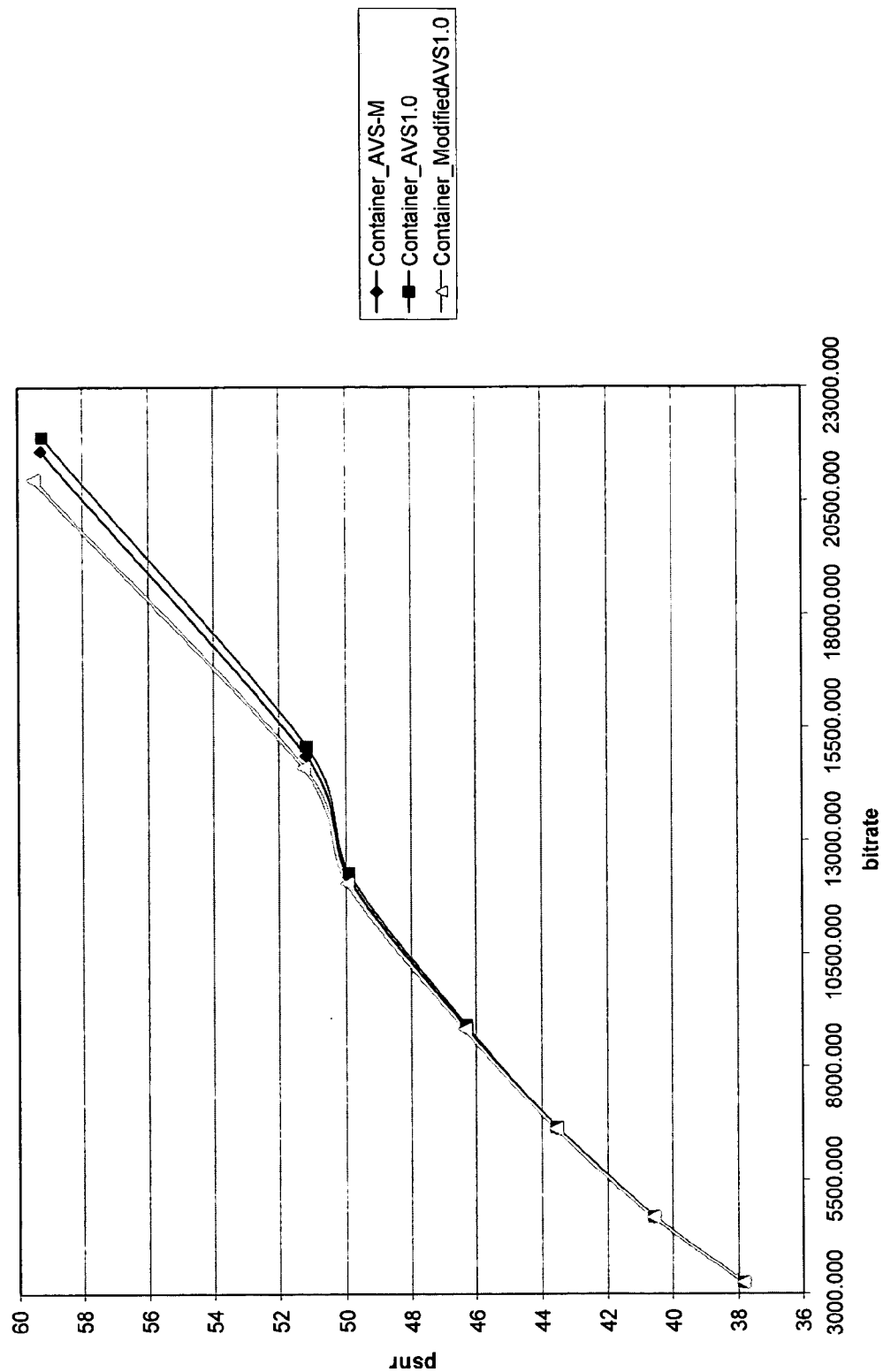
Figure 31:
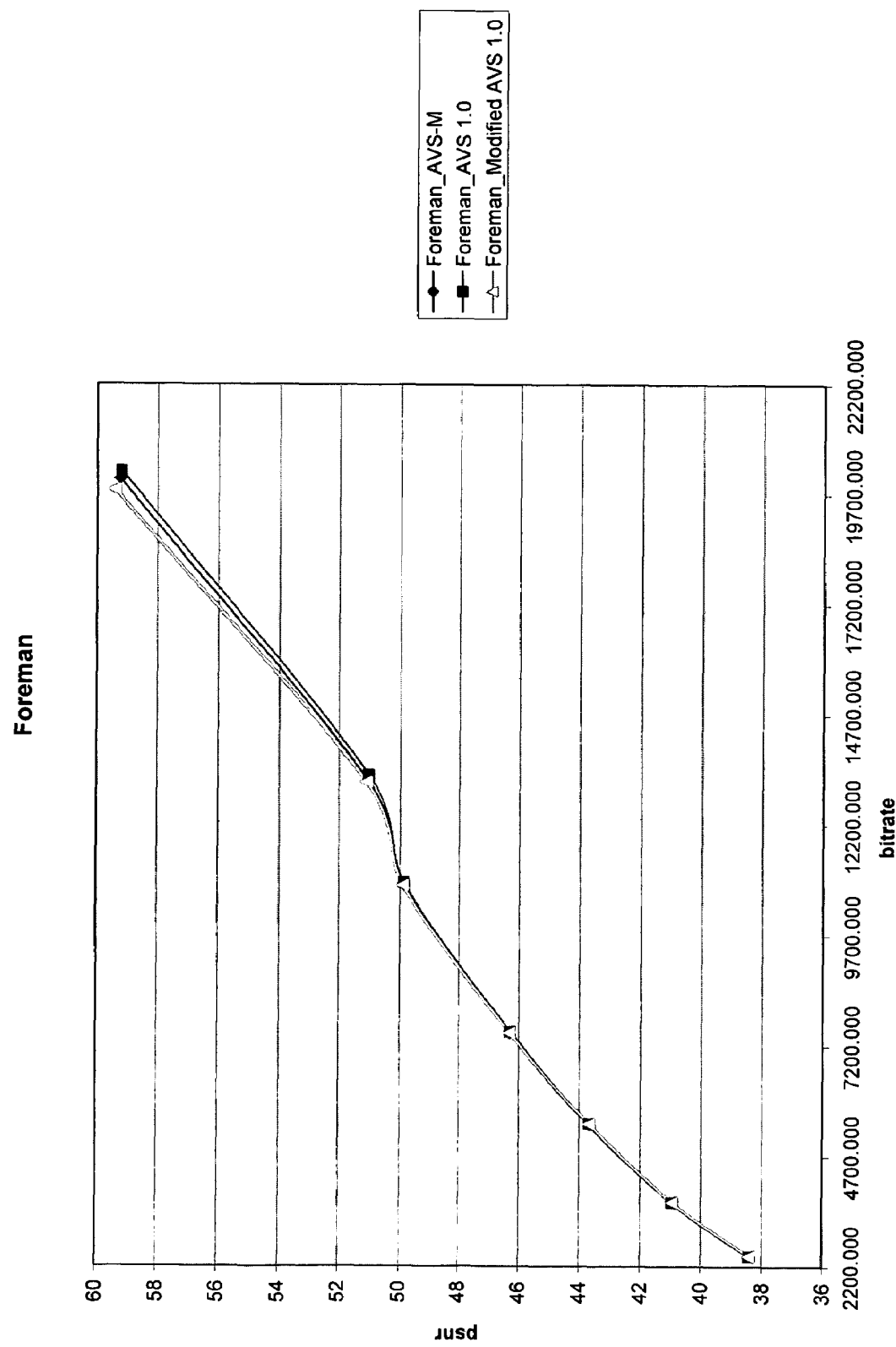

FIG. 27 shows results of encoding "BUS". BUS is a test sequence (moving picture) using a video signal format that is defined by International Telecommunication Union (ITU), and a picture size is defined as a Common Intermediate Format (CIF). In the same manner as described for FIG. 27, FIG. 28 shows results of encoding "Paris" in CIF size. FIG. 29 shows results of encoding "Tempete" in CIF size. FIG. 30 shows results of encoding "Container" in CIF size. FIG. 31 shows results of encoding "Foreman" in CIF size. BUS, Paris, and the like represent names of the test sequences. The following describes the comparison results in FIGS. 27 to 31.

Escape Code in the AVS-M uses a two-dimensional VLC method for indicating Run and Level information that are outside of the table.

The basic concept is described below. If CodeNum is less than 39 (CodeNum<39), Run and Level information are obtained using the CodeNum table. On the other hand if CodeNum is equal to or greater than 39, Run and Level information are obtained as follows.

```
{
AbsLevelDiff = (CodeNum−39)/32 + 1;
Run = ((CodeNum−39)%32)/2;
Sign = (CodeNum−39)&0x01;
}
```

(Problem with AVS-M)

However, there is a possibility that the Escape Code of the AVS-M would generate quite large values for CodeNum. In the case of Level, maximum value of Level is [−2048, 2047]. Therefore, if Run is equal to 3 for the VLC_Intra6 case, the maximum value of AbsLevelDiff can be 2048.

Assuming Run is equal to zero, the generated CodeNum will be (7+AbsLevelDiff*32+Run*2+Sign)=65550, which is slightly greater than 16 bits. As a result, an Exp-Golomb code obtained by encoding the CodeNum can be greater than 32 bits as well.

The second problem with large values CodeNum is a possibility of generating a synchronizing pattern that is identical to a start code. The bit pattern in which values of 1 follows consecutive 16 zeros is called a start code and used as a special code indicating a beginning of a bitstream. Therefore, if the above bit pattern is generated besides the start code, the decoding is not performed successfully. In the previous example, the VLC has 16 zeros in front if k=0 type Exp-Golomb code is used, so that the bit pattern identical to the start code may be generated.

Moreover, if another escape code (with 6 zeros behind) exists prior to this Escape Code, the start code emulation problem may occur.

(Solution by Present Invention)

The current code design is changed to a method closer to the AVS1.0. The AVS1.0 uses two variable length codes to represent Run and Level separately for values of Run and Level that are outside of the CodeNum table.

Applying the AVS1.0 method in the AVS-M context, if CodeNum is less than 39 (CodeNum<39), Run and Level are decoded using the CodeNum table. On the other hand, if CodeNum is equal to or greater than 39, Run and Level information are obtained as follows.

```
{
Run = ((CodeNum−39)%32)/2;
Sign = (CodeNum−39)&0x01;
AbsLevelDiff = CodeNum of second VLC + 1;
}
```

However, the problem with the AVS1.0 method is that the compression rate is lower compared to the method introduced in the AVS-M. Thus the following method is proposed to provide better performance than both of the methods in the AVS1.0 and the AVS-M.

According to the present invention, if CodeNum is less than 39 (CodeNum<39), Run and Level are decoded using the CodeNum table. On the other hand, if CodeNum is equal to or greater than 39, Run and Level information are obtained as follows.

```
if( CodeNum < 71),
{
Run = ((CodeNum−39)%32)/2;
Sign = (CodeNum−39)&0x01;
AbsLevelDiff = 1;
}
else
{
AbsLevelDiff = ((CodeNum−71)%32)/2 + 2;
Sign = (CodeNum−71)&0x01;
Run = CodeNum of second VLC ;
}
```

In the present invention, two VLC codes instead of one are used to reduce the range of CodeNum. However, in the case where AbsLevelDiff is equal to 1, it is not necessary to use the second VLC unlike AVS 1.0. Furthermore, in the present invention, if CodeNum is greater than 71, the first VLC code represents the Level information and the second VLC code represents the Run information.

The reason why this method is chosen is because the CodeNum range for the first VLC code is much larger than the second VLC. For example, if CodeNum is equal to 71, the VLC code becomes "0000001000111" for k=0 Exp-Golomb code. Within the same size of VLC, the largest CodeNum is 126. Therefore the range of AbsLevelDiff can be between 1 to 27. Furthermore, in most escape code situation, the values of Level are much larger than the values of Run. Thus this method will be much better in the above reason.

Moreover, since the second VLC is used to encode Run, the possibility of a long series of zeros will never occur as the values of Run are less than 16.

For example, if AbsLevelDiff is equal to 10 and Run is equal to 2, the AVS-M will generate a CodeNum of 363="00000000101101100" (17 bits).

AVS 1.0 will produce:

First CodeNum of 43="00000101100" (11 bits); and
SecondCodeNum of 9="0001010" (7 bits).

The present invention will produce:

First CodeNum of 91="0000001011011" (12 bits); and
SecondCodeNum of 2="011" (3 bits).

The results of this method are shown in FIGS. 27 to 31. Results show that the performance of the present invention is much better than the two methods used in the AVS1.0 and the AVS-M.

The results are obtained using all I pictures for CIF resolution video sequences at QP range of 0 to 30. This range of QP values has been chosen because of the higher occurrence of Escape Codes within these operational range of QP within the AVS-M specification.

The performance of the AVS-M Escape Code is slightly better than the performance of the AVS1.0 method. However, in the method of the AVS-M Escape Code, maximum possible value of CodeNum in the standard is increased by 32 times. Thus, some problems occur in the decoding of such large values CodeNum. Moreover, there is a possibility of generating a stream with the start code emulation problem. According to the present invention, it is possible to solve all of the above problems and to encode Escape Code with a higher compression rate compared to the methods used in the AVS-M and the AVS1.0.

Note that in the above embodiment, CodeNum in the second range are the type-1 Escape Codes, but CodeNum in the second range can be the type-2 Escape Code instead. This means that the predetermined range may be a range combining the second range and the third range, and CodeNum in the predetermined range may encode Run and Level to separate variable length codes.

Note that functional blocks in the block diagrams of FIGS. 21 and 22 are typically realized as a single large scale integrated circuit (LSI). This LSI may be integrated into a single chip or integrated separately. For example, the functional blocks except a memory can be integrated into a single chip. Here the integrated circuit is called LSI, but can be called an IC, a system LSI, a super LSI or an ultra LSI depending on their degrees of integration.

The integrated circuit is not limited to the LSI, and it may be implemented as a dedicated circuit or a general-purpose processor. It is also possible to use a Field Programmable Gate Array (FPGA) that can be programmed after manufacturing the LSI, or a reconfigurable processor in which connection and setting of circuit cells inside the LSI can be reconfigured.

Furthermore, if due to the progress of semiconductor technologies or their derivations, new technologies for integrated circuits appear to be replaced with the LSIs, it is, of course, possible to use such technologies to implement the enclosed functional blocks as an integrated circuit. For example, biotechnology and the like can be applied to the above implementation.

Still further, only a memory in those functional blocks may not be integrated into a single chip, but may form another function as a recording medium.

Still further, among those functional blocks in the block diagrams of FIGS. 21 and 22 and flowcharts as shown in FIGS. 23 to 26, a main part is also realized by a processor and a program.

Thus, the video encoding method and video decoding method described in the above embodiment can be used in any of the above apparatuses, thereby it is possible to achieve the effects described in the above embodiment.

Although only the exemplary embodiment of the present invention has been described in detail above, those skilled in the art will be readily appreciate that many modifications are possible in the exemplary embodiment without materially departing from the novel teachings and advantages of the present invention. Accordingly, all such modifications are intended to be included within the scope of the present invention.

INDUSTRIAL APPLICABILITY

The present invention is suitable for encoding apparatus and decoding apparatus of encoding and decoding video, and also suitable for: a web server for distributing the video; a network terminal for receiving the distributed video; a digital camera, a portable telephone with a camera function, a DVD recording and reproduction apparatus, a PDA, and a personal computer, which are able to record and reproduce the received video; and the like.

What is claimed is:

1. An encoding method of encoding a Run symbol and a Level symbol to a variable length code using a table in which a code number corresponds to the Run symbol and the Level symbol, the Run symbol indicating a number of consecutive coefficients each having a value of zero, and the Level symbol indicating a value of a non-zero coefficient following the Run symbol, said encoding method comprising:

deciding the Run symbol and the Level symbol;

determining whether the Run symbol and the Level symbol belong to one of a first range and a predetermined range;

obtaining a code number corresponding to the Run symbol and the Level symbol by referring to the table and encoding the obtained code number to a variable length code, when it is determined that the Run symbol and the Level symbol belong to the first range; and encoding the Level symbol to a variable length code and encoding the Run symbol to another variable length code, without referring to the table, when it is determined that the Run symbol and the Level symbol belong to the predetermined range, wherein the first range includes Run and Level symbols that exist in the table, and the predetermined range includes the Run and Level symbols corresponding to code numbers that are larger than code numbers corresponding to the Run and Level symbols in the first range.

2. The encoding method according to claim 1, further comprising:

counting the number of encoded coefficients;

determining whether the currently encoded coefficient is a last non-zero coefficient in a block;

determining whether the counted number of the coefficient reaches the number of all coefficients in the block, when it is determined that the currently encoded coefficient is the last non-zero coefficient;

encoding an EOB symbol indicating an end of an encoded sequence indicating a single block, when it is determined that the counted number of the coefficients does not reach the number of all coefficients in the block; and eliminating said encoding of the EOB symbol, when it is determined that the counted number of the coefficients reaches the number of all coefficients in the block.

3. An encoding apparatus which encodes a Run symbol and a Level symbol to a variable length code using a table in which a code number corresponds to the Run symbol and the Level symbol, the Run symbol indicating the number of consecutive coefficients each having a value of zero, and the Level symbol indicating a value of a non-zero coefficient following the Run symbol, said encoding apparatus comprising:

- a decision unit operable to decide the Run symbol and the Level symbol;
- a determination unit operable to determine whether the Run symbol and the Level symbol belong to one of a first range and a predetermined range;
- an encoding unit operable to obtain a code number corresponding to the Run symbol and the Level symbol by referring to the table and to encode the obtained code number to a variable length code, when it is determined that the Run symbol and the Level symbol belong to the first range; and
- an encoding unit operable to encode the Level symbol to a variable length code and to encode the Run symbol to another variable length code, without referring to the table, when it is determined that the Run symbol and the Level symbol belong to the predetermined range, wherein the first range includes the Run and Level symbols that exist in the table, and the predetermined range includes the Run and Level symbols corresponding to code numbers that are larger than code numbers corresponding to the Run and Level symbols in the first range.

* * * * *